United States Patent
Shin et al.

(10) Patent No.: US 9,257,360 B2
(45) Date of Patent: Feb. 9, 2016

(54) BACKPLANE FOR DISPLAY DEVICE, AND DISPLAY DEVICE INCLUDING THE SAME

(71) Applicant: Samsung Display Co., Ltd., Yongin, Gyeonggi-Do (KR)

(72) Inventors: Young-Jun Shin, Yongin (KR); Se-Hun Park, Yongin (KR); Jae-Hwan Oh, Yongin (KR); Young-Jin Chang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 53 days.

(21) Appl. No.: 14/218,224

(22) Filed: Mar. 18, 2014

(65) Prior Publication Data

US 2015/0155219 A1    Jun. 4, 2015

(30) Foreign Application Priority Data

Dec. 2, 2013   (KR) .......................... 10-2013-0148787

(51) Int. Cl.
| | |
|---|---|
| *G02F 1/136* | (2006.01) |
| *H01L 23/367* | (2006.01) |
| *H01L 27/12* | (2006.01) |
| *H01L 23/373* | (2006.01) |
| *G02F 1/1368* | (2006.01) |
| *H01L 29/786* | (2006.01) |

(52) U.S. Cl.
CPC ............ *H01L 23/367* (2013.01); *G02F 1/1368* (2013.01); *H01L 23/3738* (2013.01); *H01L 27/1222* (2013.01); *H01L 29/78606* (2013.01); *H01L 29/78618* (2013.01); *H01L 29/78675* (2013.01); *H01L 29/78696* (2013.01); *G02F 2001/13685* (2013.01); *H01L 2924/0002* (2013.01)

(58) Field of Classification Search
CPC ...................................................... H01L 23/367
See application file for complete search history.

(56) References Cited

U.S. PATENT DOCUMENTS

| | | | | |
|---|---|---|---|---|
| 5,297,001 A | * | 3/1994 | Sterling | 361/717 |
| 5,369,301 A | * | 11/1994 | Hayashi et al. | 257/722 |
| 2001/0038097 A1 | | 11/2001 | Inoue | |
| 2004/0075781 A1 | | 4/2004 | Sohn | |
| 2005/0139918 A1 | | 6/2005 | Lee | |
| 2010/0091463 A1 | * | 4/2010 | Buresch et al. | 361/718 |
| 2015/0062819 A1 | * | 3/2015 | Oughton et al. | 361/700 |

FOREIGN PATENT DOCUMENTS

| | | |
|---|---|---|
| KR | 1999-0072018 A | 9/1999 |
| KR | 10-2004-0033830 A | 4/2004 |
| KR | 10-2007-0002640 A | 1/2007 |
| KR | 10-1044489 B1 | 6/2011 |

* cited by examiner

*Primary Examiner* — Timothy L Rude
(74) *Attorney, Agent, or Firm* — Knobbe, Martens, Olson & Bear, LLP

(57) ABSTRACT

A backplane for a display device and the display device are disclosed. In one aspect, the backplane includes a substrate, an active layer formed over the substrate including a channel region, a source region contacting a first side of the channel region, and a drain region contacting a second side of the channel region. The backplane further includes a gate electrode formed adjacent to the channel region, a source electrode electrically connected to the source region, and a drain electrode electrically connected to the drain region. The active layer includes a plurality of heat radiation pins that extend in a direction of the thickness of the active layer.

20 Claims, 4 Drawing Sheets

BACKPLANE FOR DISPLAY DEVICE, AND DISPLAY DEVICE INCLUDING THE SAME

CROSS-REFERENCE TO RELATED APPLICATIONS

This application claims the benefit of Korean Patent Application No. 10-2013-0148787, filed on Dec. 2, 2013, in the Korean Intellectual Property Office, the disclosure of which is incorporated herein in its entirety by reference.

BACKGROUND

1. Field

The described technology generally relates to a display device.

2. Description of the Related Technology

Flat panel displays such as an organic light-emitting diode (OLED) display, a liquid crystal display (LCD), etc. are formed on a substrate. A pixel circuit formed on a substrate can include at least one thin film transistor (TFT), a capacitor, and lines for electrically connecting components such as the TFT and the capacitor.

SUMMARY OF CERTAIN INVENTIVE ASPECTS

One inventive aspect is a backplane for a display device, and a display device including the same.

Another aspect is a backplane for a display device that includes a substrate and an active layer formed on the substrate that includes a channel region, a source region contacting one side end of the channel region, and a drain region contacting the other side end of the channel region. The backplane further includes a gate electrode disposed while corresponding to the channel region, a source electrode electrically connected to the source region, and a drain electrode electrically connected to the drain region, wherein the active layer includes a plurality of heat radiation pins that extend in a direction with respect to a thickness of the active layer.

The gate electrode can be formed on the channel region, and the plurality of heat radiation pins can extend in a direction opposite to a direction in which the active layer faces the gate electrode.

A first insulation layer can be positioned between the substrate and the active layer.

A length of each of the plurality of heat radiation pins can be less than a thickness of the first insulation layer.

The plurality of heat radiation pins can include a material that is equal to a material for forming the channel region.

The plurality of heat radiation pins can be disposed in the channel region.

The plurality of heat radiation pins can be disposed along an edge of the channel region.

The plurality of heat radiation pins can include a material that is equal to a material for forming at least one of the source region and the drain region.

The plurality of heat radiation pins can be disposed in at least one of the source region and the drain region.

The plurality of heat radiation pins can include poly-silicon.

Another aspect is a display device that includes a substrate, a thin film transistor (TFT) formed on the substrate, a display device electrically connected to the TFT, a gate electrode formed on the gate insulation layer, a source electrode electrically connected to the source region, and a drain electrode electrically connected to the drain region. The TFT includes an active layer including a channel region, a source region contacting one side end of the channel region, and a drain region contacting the other side end of the channel region. The active layer includes a plurality of heat radiation pins that extend in a direction with respect to a thickness of the active layer.

The display device can further include a buffer layer formed on the substrate, and disposed away from the gate insulation layer by having the active layer interposed therebetween.

The plurality of heat radiation pins can extend from a first surface of the active layer toward the buffer layer, wherein the first surface faces the buffer layer.

The buffer layer can include a plurality of grooves, and the plurality of heat radiation pins can be formed in the plurality of grooves, respectively.

A length of each of the plurality of heat radiation pins can be less than a thickness of the buffer layer.

The plurality of heat radiation pins can be disposed in the channel region.

The plurality of heat radiation pins can be disposed along an edge of the channel region.

The plurality of heat radiation pins can be disposed in at least one of the source region and the drain region.

The display device can include a pixel electrode electrically connected to at least one of the source electrode and the drain electrode and an intermediate layer formed on the pixel electrode including an organic emission layer, and an opposite electrode formed on the intermediate layer.

The display device can include a first pixel electrode electrically connected to at least one of the source electrode and the drain electrode, a liquid crystal layer formed on the first pixel electrode; and a second pixel electrode formed on the liquid crystal layer and facing the first pixel electrode.

Another aspect is a backplane for a display device, the backplane comprising: a substrate; an active layer formed over the substrate, wherein the active layer comprises i) a channel region including first and second sides opposing each other, ii) a source region contacting the first side of the channel region, and iii) a drain region contacting the second side of the channel region; a gate electrode formed adjacent to the channel region; a source electrode electrically connected to the source region; and a drain electrode electrically connected to the drain region, wherein the active layer comprises a plurality of heat radiation pins, and wherein the heat radiation pins extend in a direction of the thickness of the active layer.

In the above backplane, the gate electrode is formed over the channel region, and the direction extends downwardly from the gate electrode. The above backplane further comprises a first insulation layer formed between the substrate and the active layer. In the above backplane, the length of each of the heat radiation pins is less than the thickness of the first insulation layer. In the above backplane, the heat radiation pins and the channel region are formed of the same material.

In the above backplane, the heat radiation pins are formed in the channel region. In the above backplane, the heat radiation pins are formed along an edge of the channel region. In the above backplane, the heat radiation pins are formed of a material the same as a material for forming the source region and/or the drain region. In the above backplane, the heat radiation pins are formed in the source region and/or the drain region. In the above backplane, the heat radiation pins are formed at least partially of poly-silicon.

Another aspect is a display device, comprising: a substrate; a thin film transistor (TFT) formed over the substrate; and a display unit electrically connected to the TFT, wherein the TFT comprises i) an active layer comprising a channel region including first and second sides opposing each other, a source region contacting the first side of the channel region, and a drain region contacting the second side of the channel region, wherein the active layer comprises a plurality of heat radiation pins extending in a direction of the thickness of the active layer, ii) a gate insulation layer covering the active layer, iii) a gate electrode formed over the gate insulation layer, iv) a source electrode electrically connected to the source region, and v) a drain electrode electrically connected to the drain region.

The above display device further comprises a buffer layer formed between the substrate and the active layer. In the above display device, the direction of the heat radiation pins extends downwardly from the active layer to the substrate. In the above display device, the buffer layer comprises a plurality of grooves, and the heat radiation pins are respectively formed in the grooves. In the above display device, the length of each of the heat radiation pins is less than the thickness of the buffer layer. In the above display device, the heat radiation pins are formed in the channel region. In the above display device, the heat radiation pins are formed along an edge of the channel region. In the above display device, the heat radiation pins are formed in one or more of the source region and the drain region.

The above display device further comprises: a pixel electrode electrically connected to one or more of the source electrode and the drain electrode; an intermediate layer formed over the pixel electrode, wherein the intermediate layer comprises an organic emission layer; and an opposite electrode formed over the intermediate layer.

The above display device further comprises: a first pixel electrode electrically connected to the source electrode and/or the drain electrode; a liquid crystal layer formed over the first pixel electrode; and a second pixel electrode formed over the liquid crystal layer, wherein the second pixel electrode faces the first pixel electrode.

Another aspect is a display device, comprising: a substrate; an active layer formed over the substrate, wherein the active layer comprises i) a channel region including first and second sides opposing each other, ii) a source region contacting the first side of the channel region, and iii) a drain region contacting the second side of the channel region; and at least one heat radiation pin formed in the active layer and configured to radiate heat generated in the active layer.

In the above display device, the heat radiation pin extends in a direction substantially perpendicular to the substrate. In the above display device, the direction extends downwardly from the active layer to the substrate. The above display device further comprises an insulation layer covering the heat radiation pin, wherein the length of each of the at least one heat radiation pin is less than the thickness of the insulation layer. In the above display device, the heat radiation pin extends downwardly from the channel region. In the above display device, the heat radiation pin extends downwardly from the source region and/or the drain region.

DETAILED DESCRIPTION OF CERTAIN INVENTIVE EMBODIMENTS

Figure 1:
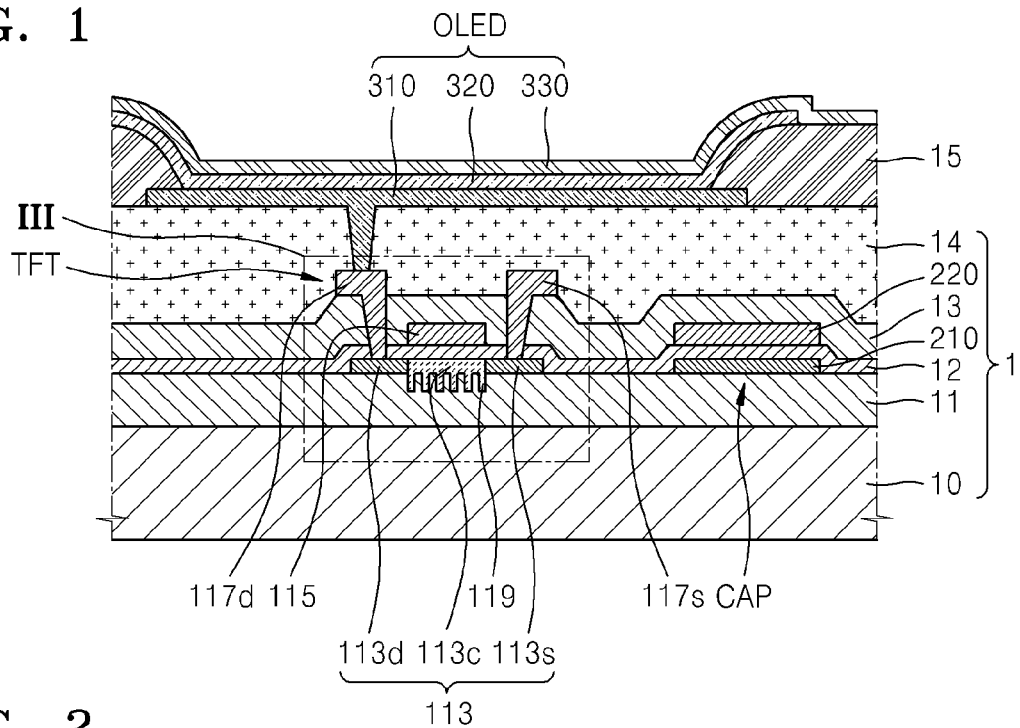
FIG. 1 is a cross-sectional view of a display device according to an embodiment.

As one or more embodiments of the described technology allow for various changes, particular embodiments will be illustrated in the drawings and described in detail in the written description. The effects and characteristics of one or more embodiments of the described technology will be described in detail by explaining exemplary embodiments of the described technology with reference to the attached drawings. However, one or more embodiments of the described technology can be embodied in many different forms, and should not be construed as being limited to the embodiments set forth herein.

Hereinafter, one or more embodiments of the described technology will be described in detail by explaining exemplary embodiments of the described technology with reference to the attached drawings Like reference numerals in the drawings denote like elements, and descriptions thereof are omitted here.

The terms "first" and "second" are used only to distinguish between each component.

Throughout the specification, a singular form can include plural forms, unless there is a particular description contrary thereto.

Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

Throughout the specification, it will also be understood that when an element such as layer, region, or substrate is referred to as being "on" another element, it can be directly on the other element, or intervening elements can also be present.

In the drawings, the thicknesses of layers and regions are exaggerated for clarity. For example, a size and thickness of each of elements in the drawings can be exaggerated, and in this regard, one or more embodiments of the described technology are not limited thereto.

Also, it should also be noted that in some alternative implementations, the steps of all methods described herein can occur out of the order. For example, two steps illustrated in succession can in fact be executed substantially concurrently or the two steps can sometimes be executed in the reverse order.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view of a display device according to an embodiment.

Referring to FIG. 1, the display device includes a backplane 1 and a display device formed on the backplane 1. The backplane 1 can include a substrate 10, at least one thin film transistor (TFT) TFT formed on the substrate 10, at least one capacitor CAP, and lines (not shown).

The substrate 10 can be a transparent glass substrate. In another embodiment, the substrate 10 can be a transparent substrate such as a plastic substrate or the like formed of a plastic material including polyethylene terephthalate (PET), polyethylene naphthalate (PEN), polyimide, etc.

A first insulation layer 11 is formed on the substrate 10. The first insulation layer 11 can be a buffer layer that can substantially prevent penetration of impurities through the substrate 10. The first insulation layer 11 can planarize a surface of the substrate 10. The first insulation layer 11 can be stacked in multiple layers using an inorganic material such as silicon nitride (SiNx) and/or silicon oxide (SiOx).

The TFT can be a top-gate type TFT including an active layer 113, a gate electrode 115, a source electrode 117s and a drain electrode 117d. The source electrode 117s and the drain electrode 117d are electrically connected to the active layer 113. In the embodiment of FIG. 1, the TFT is a driving transistor for driving an organic light-emitting diode (OLED) as a display device. The display device can further include a switching transistor (not shown) and/or a compensating transistor (not shown). The switching transistor and/or the compensating transistor can have a structure substantially equal to that of the TFT.

The active layer 113 can include a channel region 113c, a source region 113s and a drain region 113d. The source region 113s and the drain region 113d are ion impurity-doped regions in outer sides of the channel region 113c. The active layer 113 can be formed with various materials such as polysilicon (poly-Si) or an oxide semiconductor.

The active layer 113 can include a plurality of heat radiation pins 119 that extend in a substantially vertical direction with respect to the active layer 113. The active layer 113 can be interposed between the first insulation layer 11 and a second insulation layer 12. When a TFT is driven, heat is generated. However, when the generated heat is not radiated, the performance of the TFT deteriorates and the lifespan of the TFT is reduced.

However, according to the present embodiment, when the TFT is driven, heat generated in the channel region 113c can be effectively radiated.

In some embodiments, because the heat radiation pins 119 extend substantially vertically, the width of the active layer 113 does not change. Therefore, while heat is being radiated, the electrical characteristics of the TFT remain substantially the same.

The second insulation layer 12 can be formed as a gate insulation layer on the active layer 113. The second insulation layer 12 can be stacked in multiple layers including one or more materials such as $SiO_2$, SiNx, SiON, $Al_2O_3$, $TiO_2$, $Ta_2O_5$, $HfO_2$, $ZrO_2$, BST or PZT.

The gate electrode 115 can be formed on the second insulation layer 12 so as to correspond to the channel region 113c. For example, the gate electrode 115 can be formed substantially directly above the channel region 113c. Furthermore, the width of the gate electrode 115 can be substantially the same as that of the channel region 113c. The gate electrode 115 can be stacked in multiple layers including one or more metal materials. The metal materials can include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), copper (Cu) or a combination thereof.

Although not illustrated, lines such as data lines, electrode power supply lines, etc. can be formed of the same material as the source electrode 117s. Also, the drain electrode 117d can be formed on the same layer as the source electrode 117s.

A fourth insulation layer 14 can be formed on the source electrode 117s and the drain electrode 117d including one or more organic materials. The fourth insulating layer 14 can function as a planarizing insulation layer.

The capacitor CAP can include a lower electrode 210 and an upper electrode 220. The lower electrode 210 can be formed on the same layer as the active layer 113. The lower electrode can be an ion impurity-doped semiconductor such as the source region 113s and the drain region 113d. The upper electrode 220 can be formed of the same material layer as the gate electrode 115.

In some embodiments, the lower electrode 210 can be formed of the same material as the gate electrode 115. The lower electrode 210 can be formed of the same material as the source region 113s and the drain region 113d.

In the present embodiment, the display device can be the OLED. The OLED can include a pixel electrode 310, an opposite electrode 330 facing the pixel electrode 310, and an intermediate layer 320 interposed between the pixel electrode 310 and the opposite electrode 330. An opening is formed in a pixel defining layer (PDL) 15. The pixel electrode 310 and the opposite electrode 330 are formed in the opening.

The pixel electrode 310 is electrically connected to at least one of the source electrode 117s or the drain electrode 117d. When the pixel electrode 310 is used as an anode electrode, the pixel electrode 310 can include a layer formed of a metal oxide including ITO, IZO, ZnO, or the like that have a high absolute value of a work function. When the pixel electrode 310 is used as a cathode electrode, the pixel electrode 310 can be formed at least partially of a high conductive metal material such as Ag, Mg, Al, Pt, Pd, Au, Ni, Nd, Ir, Cr, Li, or Ca that have a low absolute value of the work function. When the pixel electrode 310 is used as the anode electrode, the opposite electrode 330 can be used as a cathode electrode. When the pixel electrode 310 is used as the cathode electrode, the opposite electrode 330 can be used as the anode electrode.

The intermediate layer 320 can have a multiple-layer structure in which an organic emission layer (organic EML), a hole transport layer (HTL), a hole injection layer (HIL), an electron transport layer (ETL), and an electron injection layer (EIL) are stacked.

When the display device is a top-emission type display device, the pixel electrode 310 can include a reflective electrode, and the opposite electrode 330 can be formed as a light-transmitting electrode. In this case, the opposite electrode 330 can include a translucent reflective layer formed as a thin layer with material such as Ag, Mg, Al, Pt, Pd, Au, Ni, Nd, Ir, Cr, Li or Ca. The opposite electrode 330 can be formed at least partially of a light-transmitting metal oxide including ITO, IZO, ZnO, or the like.

Figure 2:
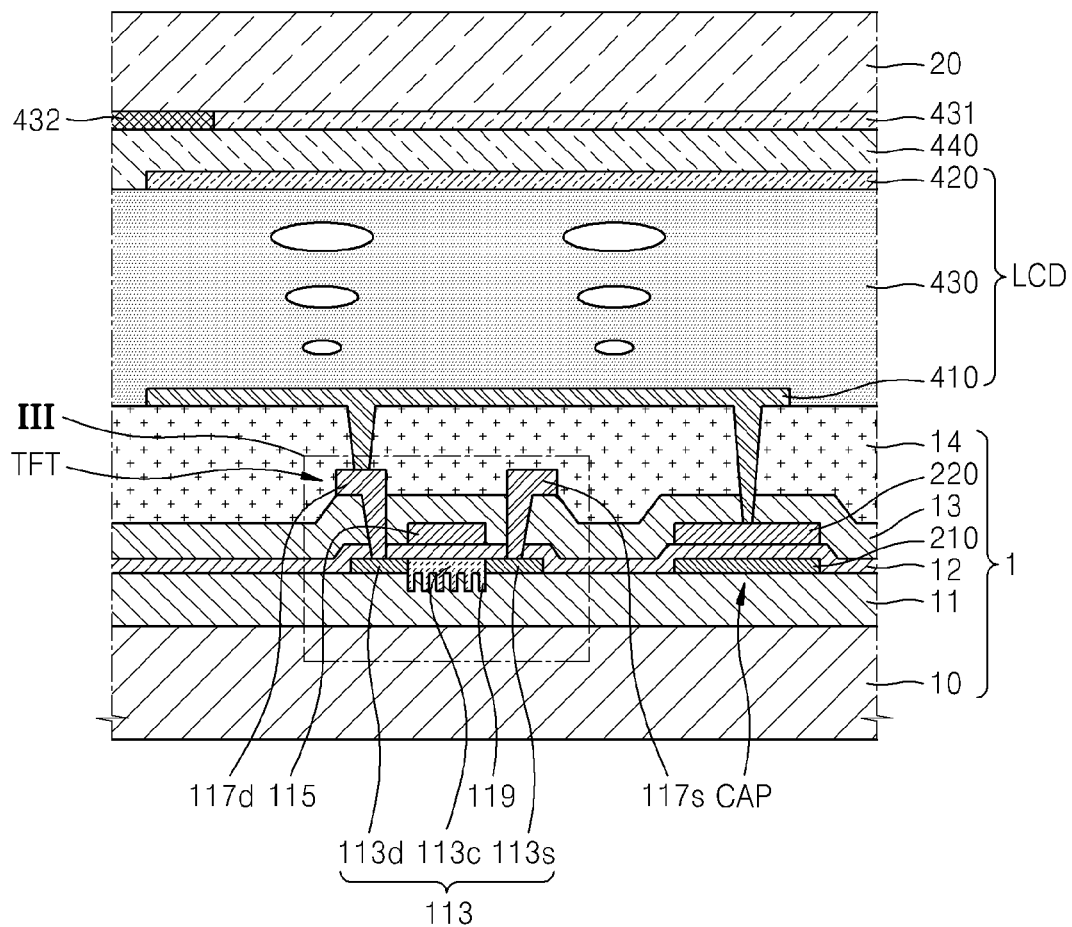
FIG. 2 is a cross-sectional view of a display device according to another embodiment.

FIG. 2 is a cross-sectional view of the display device, according to another embodiment. Hereinafter, the display device of FIG. 2 will be described with reference to differences with respect to the display device of FIG. 1.

Referring to FIG. 2, the display device according to the present embodiment can include the backplane 1 and a display device formed on the backplane 1. The backplane 1 can include the substrate 10, the at least one TFT, the at least one capacitor CAP, and lines (not shown). As described above, the TFT includes the heat radiation pins 119. In the present embodiment, the display device includes a liquid crystal display (LCD) LCD as the display device.

A liquid crystal layer 430 can be interposed between the substrate 10 and an upper substrate 20. The liquid crystal layer 430 is interposed between a first pixel electrode 410 and a second pixel electrode 420. When a voltage is applied to the first and second pixel electrodes 410 and 420, the orientation of liquid crystals is adjusted, which blocks or transmits light that is supplied from a light source (not shown).

The first pixel electrode 410 can be formed on the fourth insulation layer 14. The first pixel electrode 410 can be electrically connected to the drain electrode 117d through a via hole that penetrates through the fourth insulation layer 14. The first pixel electrode 410 can be electrically connected to the upper electrode 220 through a via hole that penetrates through the third insulation layer 13 and the fourth insulation layer 14. The first pixel electrode 410 can be formed of a material such as ITO, IZO, ZnO, or $In_2O_3$ that have a high work function.

The upper substrate 20 can be a transparent substrate like the substrate 10. A color filter 431, a black matrix 432, an overcoat layer 440, and the second pixel electrode 420 can be formed on the upper substrate 20.

The color filter 431 applies a color to the light and then the colored light passes through the liquid crystal layer 430. The color filter 431 can be formed of a photosensitive organic material. The black matrix 432 substantially prevents mixing and interference of visible rays that are realized after passing through the color filter 431.

The overcoat layer 440 can be formed on the color filter 431 and the black matrix 432, and can be formed at least partially of a material such as an acryl-based epoxy. The overcoat layer 440 can substantially protect the color filter 431.

The second pixel electrode 420 can be formed on the overcoat layer 440 and can be formed of a transparent conductive material such as ITO, IZO, or the like on the overcoat layer 440. The second pixel electrode 420 and the first pixel electrode 410 apply a voltage to the liquid crystal layer 430.

Each of the display devices described above with reference to FIGS. 1 and 2 includes the backplane 1. Hereinafter, with reference to FIGS. 3 through 7, the heat radiation pins 119 of the TFT will be described in detail.

Figure 3:
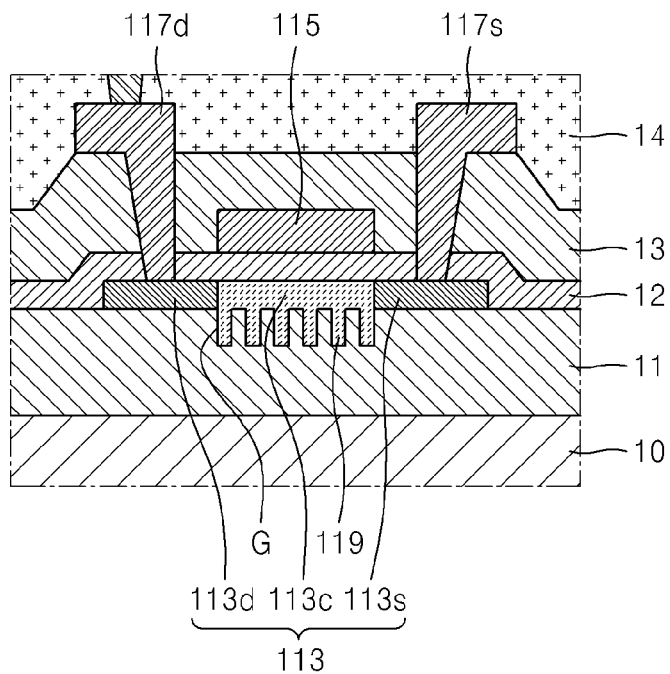
FIG. 3 is a cross-sectional view illustrating a thin film transistor (TFT) of a backplane of FIGS. 1 and 2.
Figure 4:
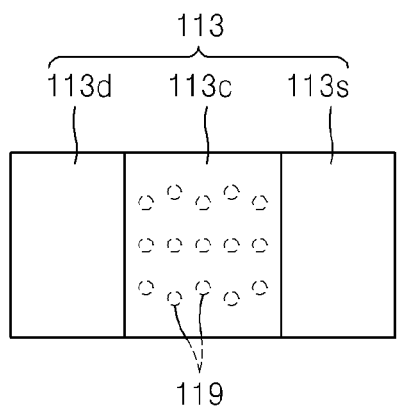
FIG. 4 is a plan view illustrating an active layer of FIG. 3.
Figure 5:
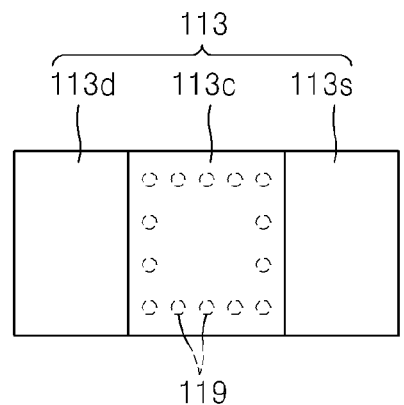
FIG. 5 is a plan view illustrating an active layer according to another embodiment.

FIG. 3 is a cross-sectional view illustrating the TFT of the backplane 1 of FIGS. 1 and 2. FIG. 4 is a plan view illustrating the active layer 113 of FIG. 3. FIG. 5 is a plan view illustrating the active layer 113 according to another embodiment.

Referring to FIGS. 3 and 4, the TFT can be a top gate type TFT in which the gate electrode 115 is formed on the active layer 113. When a voltage is applied to the gate electrode 115, an electric field is formed between the channel region 113c and the gate electrode 115. That is, a channel for a transfer of electrons (or holes) is formed in the channel region 113c.

The heat radiation pins 119 extend in a lower direction that is substantially opposite to an upper direction. That is, the heat radiation pins 119 extend in the lower direction in which the active layer 113 faces the first insulation layer 11 which is the lower direction in FIG. 3. The heat radiation pins 119 face the gate electrode 115 in the upper direction. The heat radiation pins 119 can radiate the heat of the active layer 113 while not affecting the electrical characteristics of the TFT. For example, the heat radiation pins 119 do not affect the electric field that is formed between the channel region 113c and the gate electrode 115 because the heat radiation pins 119 extend away from the electric field. A first surface of the active layer 113 faces the first insulation layer 11 and the heat radiation pins 119 can extend from the first surface of the active layer 113 toward the first insulation layer 11.

The heat radiation pins 119 can be integrally formed with the channel layer 113c via a process of forming the active layer 113 on the first insulation layer 11. For example, the active layer 113 can be formed such that the first insulation layer 11 is formed on the substrate 10 and then grooves G are formed in the first insulation layer 11 via a photolithography process and a dry etching process. A portion of the active layer 113 can be filled in the grooves G and therefore form the heat radiation pins 119.

The heat radiation pins 119 can be formed of the same material as the active layer 113. The heat radiation pins 119 can be formed at least partially of poly-Si or an oxide semiconductor like the active layer 113. Furthermore, in order to increase a heat radiation effect, the poly-Si can have excellent thermal conductivity.

The length of each heat radiation pin 119 can be less than the thickness of the first insulation layer 11. When the length of each heat radiation pin 119 is substantially equal to or greater than the thickness of the first insulation layer 11, the first insulation layer 11 does not sufficiently insulate the active layer 113 due to the heat radiation pins 119 that penetrate through the first insulation layer 11. As a result, a parasitic current flows in the active layer 113 that is not insulated by the first insulation layer 11 such that an on/off state of the TFT can be unpredictable. However, depending on embodiments, the length of each heat radiation pin 119 can be less than the thickness of the first insulation layer 11.

The heat radiation pins 119 can be formed in the channel region 113c which can have difficulty radiating heat. As shown in FIG. 4, positions of the heat radiation pins 119 can be random. In another embodiment, as shown in FIG. 5, the heat radiation pins 119 can be formed along an edge of the channel region 113c.

Figure 6:
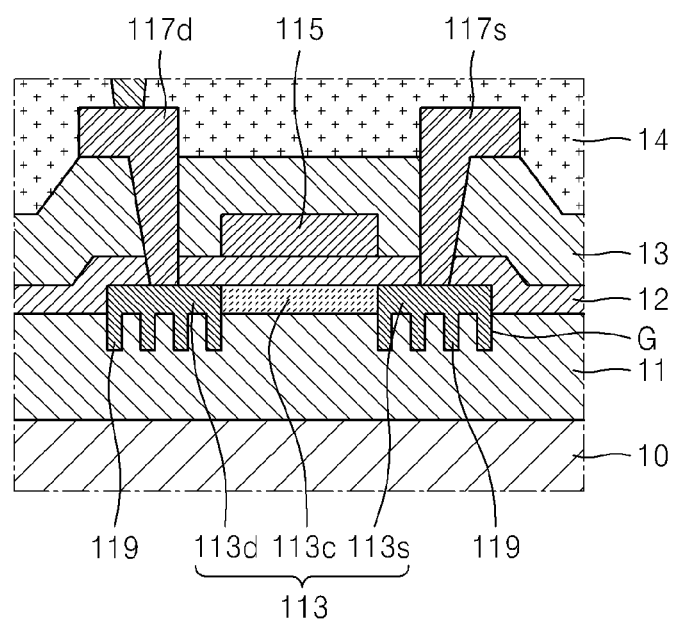
FIG. 6 is a cross-sectional view illustrating a TFT of a backplane according to another embodiment.
Figure 7:
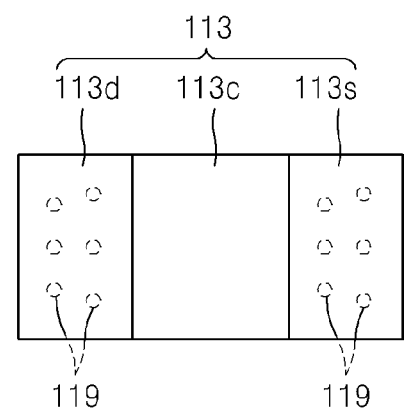
FIG. 7 is a plan view illustrating an active layer of FIG. 6.

FIG. 6 is a cross-sectional view illustrating the TFT of the backplane 1 according to another embodiment. FIG. 7 is a plan view illustrating the active layer 113 of FIG. 6.

Referring to FIGS. 6 and 7, the heat radiation pins 119 in the present embodiment can extend in the lower direction like the heat radiation pins 119 that are described above with reference to FIGS. 3-5. The heat radiation pins 119 can be formed in the grooves G. The length of each of the heat radiation pins 119 can be less than the thickness of the first insulation layer 11.

The heat radiation pins 119 can be integrally formed with the active layer 113 via the process of forming the active layer 113. For example, the heat radiation pins 119 can be integrally formed with the source region 113s and/or the drain region 113d.

The heat radiation pins 119 can be formed of the same material as at least one of the source region 113s or the drain region 113d such as poly-Si or an oxide semiconductor. For example, each heat radiation pin 119 can be formed at least partially of ion impurity-doped poly-Si. The poly-Si has excellent thermal conductivity and therefore can increase the heat radiation effect.

In some embodiments, the source region 113s and the drain region 113d do not have a portion that is affected by an electric field formed between the channel region 113c and the gate electrode 115. Thus, the heat radiation pins 119 can radiate the heat of the active layer 113 without changing the electrical characteristics of the TFT.

As described above, according to one or more of the above embodiments, the backplane 1 and the display device including the backplane 1 can improve reliability of the TFT and increase the lifespan of the TFT.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the described technology have been described with reference to the figures, it will be understood by those of ordinary skill in the art that various changes in form and details can be made therein without departing from the spirit and scope of the described technology as defined by the following claims.

What is claimed is:

1. A backplane for a display device, the backplane comprising:
   a substrate;
   an active layer formed over the substrate, wherein the active layer comprises i) a channel region including first and second sides opposing each other, ii) a source region contacting the first side of the channel region, and iii) a drain region contacting the second side of the channel region;
   a gate electrode formed adjacent to the channel region;
   a source electrode electrically connected to the source region; and
   a drain electrode electrically connected to the drain region,
   wherein the active layer comprises a plurality of heat radiation pins, and wherein the heat radiation pins extend in a direction of the thickness of the active layer.

2. The backplane of claim 1, wherein the gate electrode is formed over the channel region, and wherein the direction extends downwardly from the gate electrode.

3. The backplane of claim 1, further comprising a first insulation layer formed between the substrate and the active layer.

4. The backplane of claim 3, wherein the length of each of the heat radiation pins is less than the thickness of the first insulation layer.

5. The backplane of claim 1, wherein the heat radiation pins and the channel region are formed of the same material.

6. The backplane of claim 1, wherein the heat radiation pins are formed in the channel region.

7. The backplane of claim 1, wherein the heat radiation pins are formed along an edge of the channel region.

8. The backplane of claim 1, wherein the heat radiation pins are formed of a material the same as a material for forming the source region and/or the drain region.

9. The backplane of claim 1, wherein the heat radiation pins are formed in the source region and/or the drain region.

10. The backplane of claim 1, wherein the heat radiation pins are formed at least partially of poly-silicon.

11. A display device, comprising:
    a substrate;
    a thin film transistor (TFT) formed over the substrate; and
    a display unit electrically connected to the TFT, wherein the TFT comprises i) an active layer comprising a channel region including first and second sides opposing each other, a source region contacting the first side of the channel region, and a drain region contacting the second side of the channel region, wherein the active layer comprises a plurality of heat radiation pins extending in a direction of the thickness of the active layer, ii) a gate insulation layer covering the active layer, iii) a gate electrode formed over the gate insulation layer, iv) a source electrode electrically connected to the source region, and v) a drain electrode electrically connected to the drain region.

12. The display device of claim 11, further comprising a buffer layer formed between the substrate and the active layer.

13. The display device of claim 12, wherein the direction of the heat radiation pins extends downwardly from the active layer to the substrate.

14. The display device of claim 12, wherein the buffer layer comprises a plurality of grooves, and wherein the heat radiation pins are respectively formed in the grooves.

15. The display device of claim 14, wherein the length of each of the heat radiation pins is less than the thickness of the buffer layer.

16. The display device of claim 11, wherein the heat radiation pins are formed in the channel region.

17. The display device of claim 11, wherein the heat radiation pins are formed along an edge of the channel region.

18. The display device of claim 11, wherein the heat radiation pins are formed in one or more of the source region and the drain region.

19. The display device of claim 11, further comprising:
    a pixel electrode electrically connected to one or more of the source electrode and the drain electrode;
    an intermediate layer formed over the pixel electrode, wherein the intermediate layer comprises an organic emission layer; and
    an opposite electrode formed over the intermediate layer.

20. The display device of claim 11, further comprising:
    a first pixel electrode electrically connected to the source electrode and/or the drain electrode;
    a liquid crystal layer formed over the first pixel electrode; and
    a second pixel electrode formed over the liquid crystal layer, wherein the second pixel electrode faces the first pixel electrode.

* * * * *